(12) United States Patent
Yap et al.

(10) Patent No.: US 7,266,279 B1
(45) Date of Patent: Sep. 4, 2007

(54) OPTICALLY PUMPED STEPPED MULTI-WELL LASER

(75) Inventors: Daniel Yap, Newbury Park, CA (US);
David Chow, Newbury Park, CA (US);
Authi Narayanan, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 324 days.

(21) Appl. No.: 11/090,436

(22) Filed: Mar. 25, 2005

(51) Int. Cl.
*G02B 8/10* (2006.01)
*G02B 8/12* (2006.01)
*H01S 5/00* (2006.01)

(52) U.S. Cl. .................. 385/131; 385/14; 372/43.01

(58) Field of Classification Search .................. 372/41, 372/43.01, 45.01, 50.1, 96; 385/131, 14; 257/21, 440
See application file for complete search history.

(56) References Cited

U.S. PATENT DOCUMENTS

| | | | |
|---|---|---|---|
| 4,321,559 A | 3/1982 | Esterowitz et al. | 372/41 |
| 5,513,204 A | 4/1996 | Jayaraman | 372/96 |
| 5,754,578 A | 5/1998 | Jayaraman | 372/50.1 |
| 5,799,026 A | 8/1998 | Meyer et al. | 372/45.01 |
| 6,404,791 B1 | 6/2002 | Yang | 372/45.01 |
| 6,455,908 B1 * | 9/2002 | Johnson et al. | 257/440 |
| 2002/0125472 A1 * | 9/2002 | Johnson et al. | 257/21 |
| 2004/0096175 A1 * | 5/2004 | Tolstikhin | 385/131 |

OTHER PUBLICATIONS

U.S. Appl. No. 11/090,453, filed Mar. 25, 2005, Yap et al.
Choi, H.K., "High-Power Optically Pumped GaInSb/InAs Quantum Well Lasers With GaInAsSb Integrated Absorber Layers Emitting At 4 µm," *CMM4 of the Digest of 2000 Conference on Lasers and Electro-Optics*, pp. 63-64 (May 8, 2000).
Felix, C.L., et al., "High-Efficiency Midinfrared 'W' Laser with Optical Pumping Injection Cavity," *Applied Physics Letters*, vol. 75, No. 19, pp. 2876-2878 (Nov. 1999).
Garbuzov, D.Z., et al. "2.3-2.7-µm Room Temperature CW Operation of InGaAsSb-AlGaAsSb Broad Waveguide SCH-QW Diode Lasers," *IEEE Photonics Technology Letters*, vol. 11, No. 7, pp. 794-796 (Jul. 1999).
Gmachl, C., et al., "Ultra-Broadband Semiconductor Laser," *Letters to Nature*, vol. 415, pp. 883-887 (Feb. 2002).
Goyal, A.K., et al., "High-Efficiency Optically-Pumped Mid-IR Lasers With Integrated Absorbers," *IEEE Lasers and Electro-Optics Society 13th Annual Meeting*, pp. 249-250 (2000), no month.
Jayaraman, V., et al., "Uniform Threshold Current, Continuous-Wave, Singlemode 1300nm Vertical Cavity Lasers From 0 to 70° C.," *Electronic Letters*, vol. 34, No. 14, pp. 1405-1407 (Jul. 1998).
Meyer, J.R., et al., "Type-II Quantum-Well Lasers For The Mid-Wavelength Infrared," *Applied Physics Letters*, vol. 67, No. 6, pp. 757-759 (Aug. 1995).
Olesberg, J.T., et al., "Mid-Infrared InAs/GaInSb Separate Confinement Heterostructure Laser Diode Structures," *Journal of Applied Physics*, vol. 89, No. 6, pp. 3283-3289 (Mar. 2001).
Ongstad, Andrew P., et al., "High-Temperature Performance In ~4 µm Type-II Quantum Well Lasers With Increased Strain," *Journal of Applied Physics*, vol. 92, No. 10, pp. 5621-5626 (Nov. 2002).

(Continued)

*Primary Examiner*—Quyen P Leung
(74) *Attorney, Agent, or Firm*—Ladas & Parry

(57) ABSTRACT

An apparatus and methods for an optically pumped laser that has a cascade of light-emitting interband transitions are disclosed. The apparatus disclosed contains multistep interband cascade regions able to generate a plurality of photons for a pump photon absorbed from an optical pump source. The methods disclosed teach how to produce a plurality of photons for a pump photon absorbed from an optical pump source.

20 Claims, 7 Drawing Sheets

OTHER PUBLICATIONS

Vurgaftman, I., et al., "Photonic-Crystal Distributed-Feedback Lasers," *Applied Physics Letters*, vol. 78, No. 11, pp. 1475-1477 (Mar. 2001).

Yang, Rui, Q., et al., "Mid-Infrared Type-II Interband Cascade Lasers," *IEEE Journal of Quantum Electronics*, vol. 38, No. 6, pp. 559-568 (Jun. 2002).

* cited by examiner

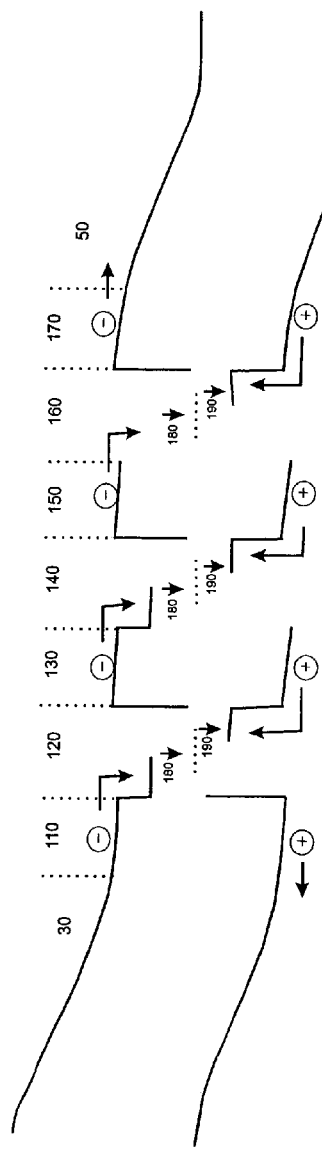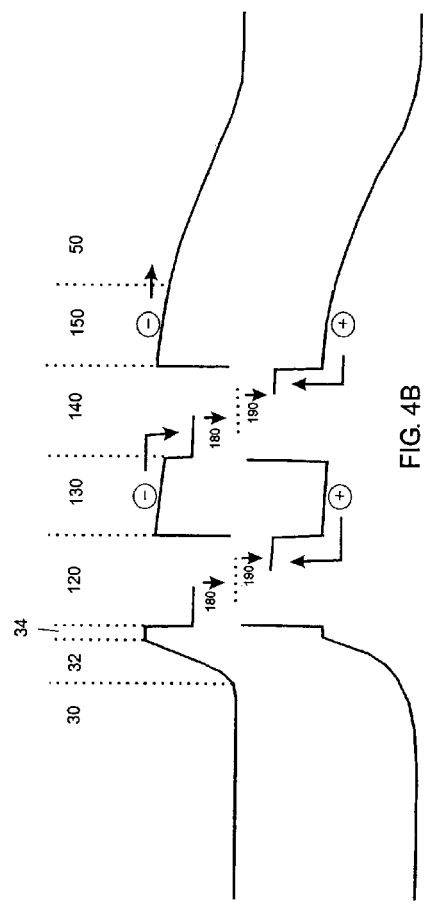

OPTICALLY PUMPED STEPPED MULTI-WELL LASER

CROSS REFERENCE TO RELATED APPLICATIONS

This application is related to co-pending application U.S. application Ser. No. 11/090,453, filed on the same date as the present application, for "Optically Pumped Laser With An Integrated Optical Pump" by Daniel Yap, Dave Persechini and Authi Narayanan, the disclosure of which is incorporated herein by reference.

FIELD

This invention relates to an optically pumped laser that makes more efficient use of the absorbed optical pump energy since one absorbed optical pump photon may result in the emission of more than one output photon by the laser.

BACKGROUND AND PRIOR ART

Optically pumped semiconductor lasers that emit at a wavelength of 2 to 5 microns or longer have typically been preferably pumped by light that has a wavelength close to and slightly shorter than the wavelength emitted by the optically pumped laser. In a typical optically pumped laser (OPL) each photon of the pump light can generate at most one electron-hole pair, by exciting an electron (the electrical charge carrier) from the valence band into the conduction band. The excited electron then can make an optical transition back to the valence band (an interband transition that also can be described as having the electron recombine with a hole) to produce at most one photon of the light emitted by the OPL. If the energy of the pump photon is much higher than the energy of the photon emitted by the OPL, the excess pump energy typically is not used effectively. Instead, the excess pump energy, which is related to the difference in the wavelengths of the pump light and the light produced by the optically pumped laser (OPL), is typically converted to heat. This heat must be removed. Otherwise, the temperature of the optically pumped laser can increase and the non-radiative processes, such as Auger recombination, that occur in the optically pumped laser can reduce the efficiency of that laser or can prevent that laser from operating at high output powers.

The more efficient semiconductor pump lasers emit at shorter wavelengths such as 0.98, 1.48 and 1.55 microns. These wavelengths can be quite different from the wavelength of the OPL. Thus, those OPL that are pumped by these more efficient pump lasers could be subject to more heating. It is desirable to make more efficient use of the pump energy so that less heat is produced in the OPL that are pumped by shorter-wavelength light.

One way to improve the efficiency of the laser is to use an energy cascade that enables one electron injected into the cascade to undergo multiple transitions, thereby generating multiple photons. Although some prior lasers have a cascade of interband or intraband wells, these prior art lasers require application of an external electrical voltage to establish the cascade (that voltage being supplied with the electrical pumping).

Electrically pumped cascade lasers that employ interband transitions for emission of the light are described in U.S. Pat. Nos. 5,799,026 and 6,404,791, with an extensive review of those lasers given in IEEE Journal of Quantum Electronics, v.38, n.6, pp. 559-568 (2002). Electrically pumped cascade lasers that employ intraband cascade laser with wide emission spectrum is described in Nature, v.415, pp. 883-887 (2002). In these prior art lasers, the electrons and holes that recombine to produce the emitted light are supplied from an external source of electrical current, such as a battery or a power supply. These prior lasers have to be electrically pumped to achieve the cascade, since it is the externally applied voltage accompanying the externally supplied current that establishes the electric field across the structure that forms the cascade of light-emitting regions and carrier injection regions in these prior lasers. Unlike these prior art electrically pumped lasers, the present specification discloses optically pumped lasers that are not externally biased to achieve the cascade.

Optically pumped lasers can potentially be more efficient than electrically pumped lasers. Part of this greater efficiency is achieved because the OPL does not need to have any p-doped layers. The free-carrier absorption that especially occurs in the p-doped layers of electrically pumped lasers is an undesirable loss mechanism. The amount of free-carrier absorption can be much lower in the optically pumped lasers.

Optically pumped lasers with integrated pump-light absorbing layers are described in paper CMM4 of the Digest of 2000 Conference on Lasers and ElectroOptics (CLEO), pages 63-64 and in Journal of Applied Physics, v.92, n.10, pp. 5621-5626 (2002). Unlike these prior art optically pumped lasers, the present specification discloses OPL containing integrated pump-light absorbers that have tilted valence and conduction bands. Such tilted bands would have no benefit in these prior art lasers and would unnecessarily complicate their construction.

Antimonide-based lasers that have light-emitting regions comprising W-shaped potential well structures with staggered, Type-II band alignments are described in Applied Physics Letters, v.67, n.6, pp. 757-759 (1995) and in Journal of Applied Physics, v.89, n.6, pp. 32883-3289 (2001). To improve the lasing efficiency, it is preferred in these prior art lasers that the W-shaped wells in them all be the same. Some embodiments of the present specification likewise make use of W-shaped potential wells. In contrast to the prior art, however, the presently disclosed Type II antimonide lasers implement cascades comprising multiple W-shaped potential wells that are not the same. According to the present disclosure, at least two different kinds of W-wells are implemented in each cascade.

BRIEF DESCRIPTION OF THE FIGURES AND THE DRAWINGS

FIG. 4A depicts an exemplary energy band diagram for optically pumped interband cascade laser depicted in FIG. 1;

FIG. 4B depicts another exemplary energy band diagram for optically pumped interband cascade laser depicted in FIG. 1;

DETAILED DESCRIPTION

A semiconductor laser uses electrons that have been excited or injected into the conduction band states of a semiconductor material. These excited, higher-energy electrons can then make an electronic transition into a lower energy state while simultaneously emitting one or more photons of light. For an interband laser, the electronic transition is from a state in the conduction band to a state in the valence band of the semiconductor material. For an intraband laser, the electronic transition is from a higher-energy state in the conduction band to a lower-energy state in the conduction band (i.e., between states in the same band). For an optically pumped laser, the excited electron may be produced as a result of absorption of a photon of the pump light. This excites the electron from being in a valence-band state into a conduction-band state. For an electrically pumped laser, the excited electron may be injected into the conduction band of the material from an external electrical source.

In contrast to prior art electrically pumped cascade lasers (either interband or intraband), discussed above, the present specification discloses an interband cascade laser that is optically pumped as will be seen. The basic feature of the interband cascade optically pumped laser (IC-OPL) is a combination of optical absorbing barrier layers, multi-step cascades of interband light-emitting well regions and tunneling barriers between the steps of the cascade. This combination permits the efficient use of shorter (0.98, 1.48 and 1.55 microns) optical pump wavelengths (higher pump photon energies), at which more efficient and higher power pump lasers are available. The multi-step interband optical cascade makes more efficient use of the absorbed optical pump energy since one absorbed optical pump photon may result in the emission of more than one output photon by the OPL. The multi-step interband cascade regions are preferably constructed as a result of the epitaxial material designs, which is compatible with the optically pumped operation, rather than as a result of an externally applied voltage, as in the prior cascade lasers described above, which are electrically pumped.

Figure 1:
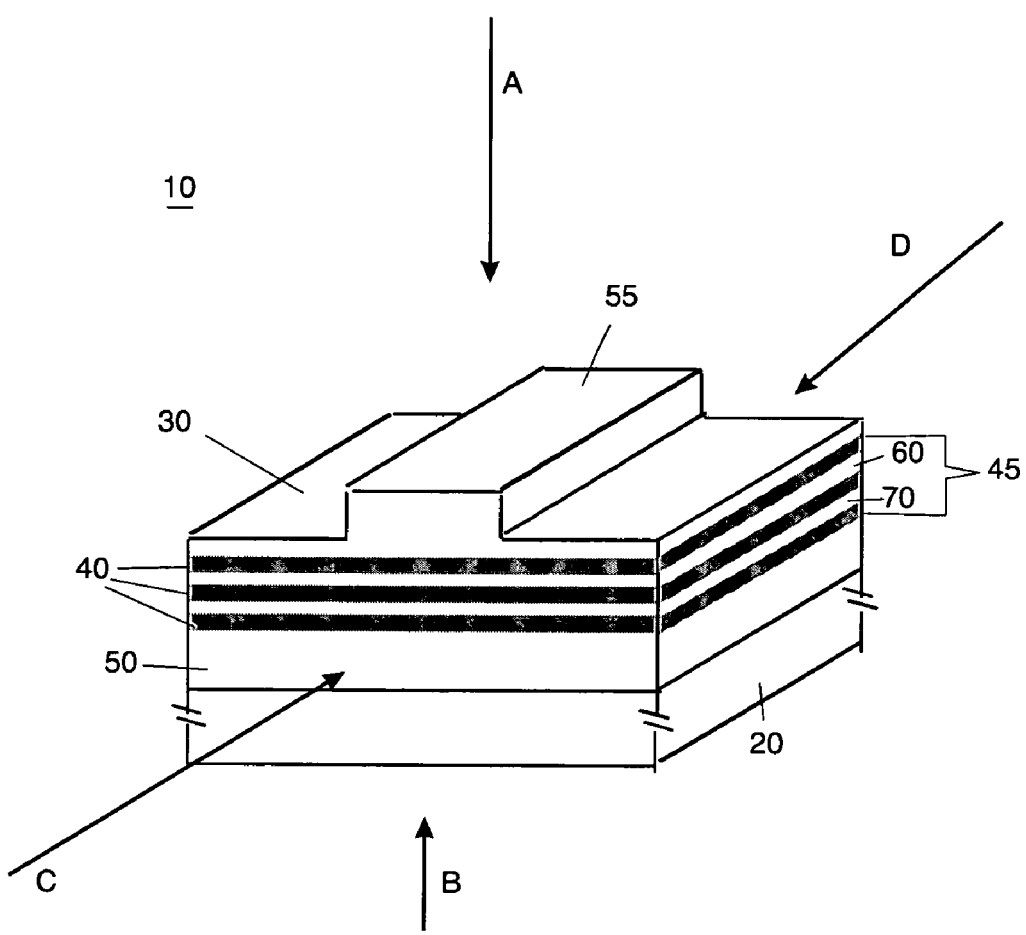
FIG. 1 depicts an exemplary perspective view of an optically pumped interband cascade laser.

Referring to FIG. 1, in one exemplary embodiment, the cross-sectional structure of the interband cascade IC-OPL 10 may comprise one or more substructures 40 that may be combined as a vertically arranged stack. The IC-OPL 10 may be fabricated on a semiconductor substrate 20 of a material such as GaSb. The IC-OPL 10 may also comprise optional cladding layers 30 and 50. The combination of substructures 40 form a core region 45 of the optical waveguide and the cladding layers 30 and 50 form waveguide cladding that sandwiches the core region 45. Other layers of cladding material 60, 70 may further separate the adjacent substructures 40 from one another. The cladding layers 30, 50, 60 and 70 may comprise AlGaInAsSb material or subsets of this material such as AlAsSb or AlGaAsSb.

An external pump light may be supplied from the topside of the IC-OPL structure 10, as illustrated by arrow A in the FIG. 1, from the bottom side, as illustrated by arrow B in the FIG. 1, or from the ends of the IC-OPL structure 10, as illustrated by arrows C and D in the FIG. 1.

Although IC-OPL 10 has a ridge 55 waveguide, other types of laser structures that yield well defined optical emission patterns, for example distributed feedback structures whose gratings are tilted at an angle to the end faces, may also be used. These and other suitable structures are disclosed in Applied Physics Letters, v.78, n.11, pp. 1475-1477 (2001), incorporated herein in its entirety by this reference.

Figure 2:
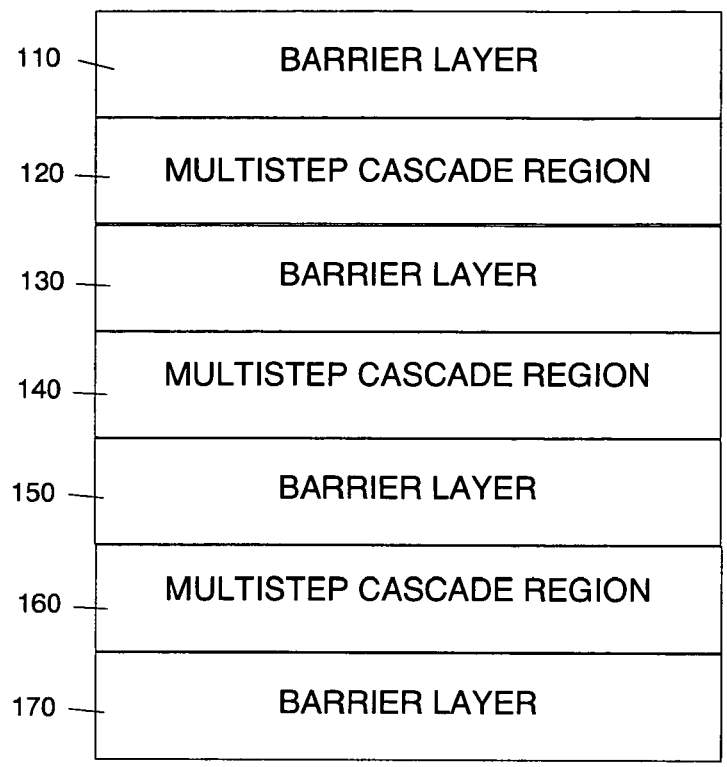
FIG. 2 depicts an exemplary layer structure comprising a portion of an optically pumped interband cascade laser depicted in FIG. 1.
Figure 3A:
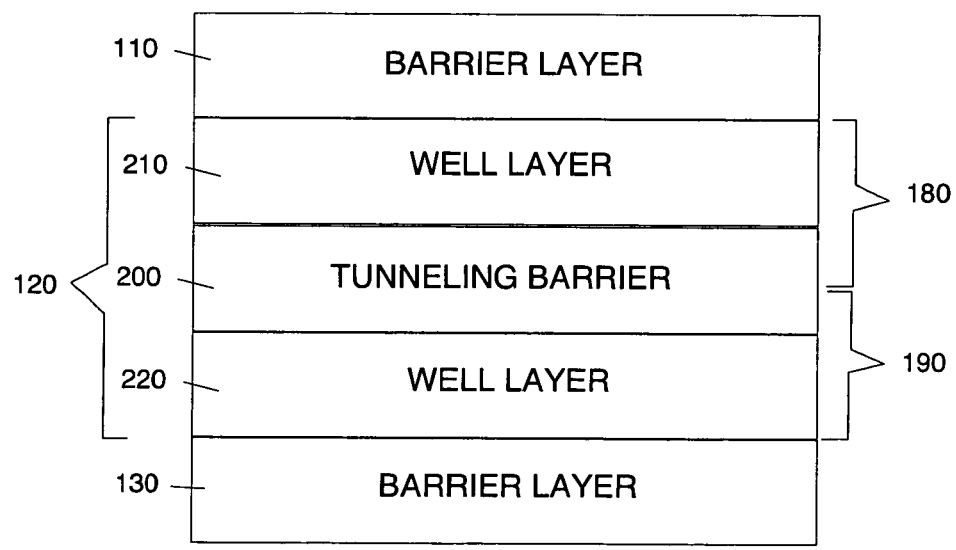
FIG. 3A depicts an exemplary embodiment of a layer structure comprising a multi-step interband cascade region.
Figure 3B:
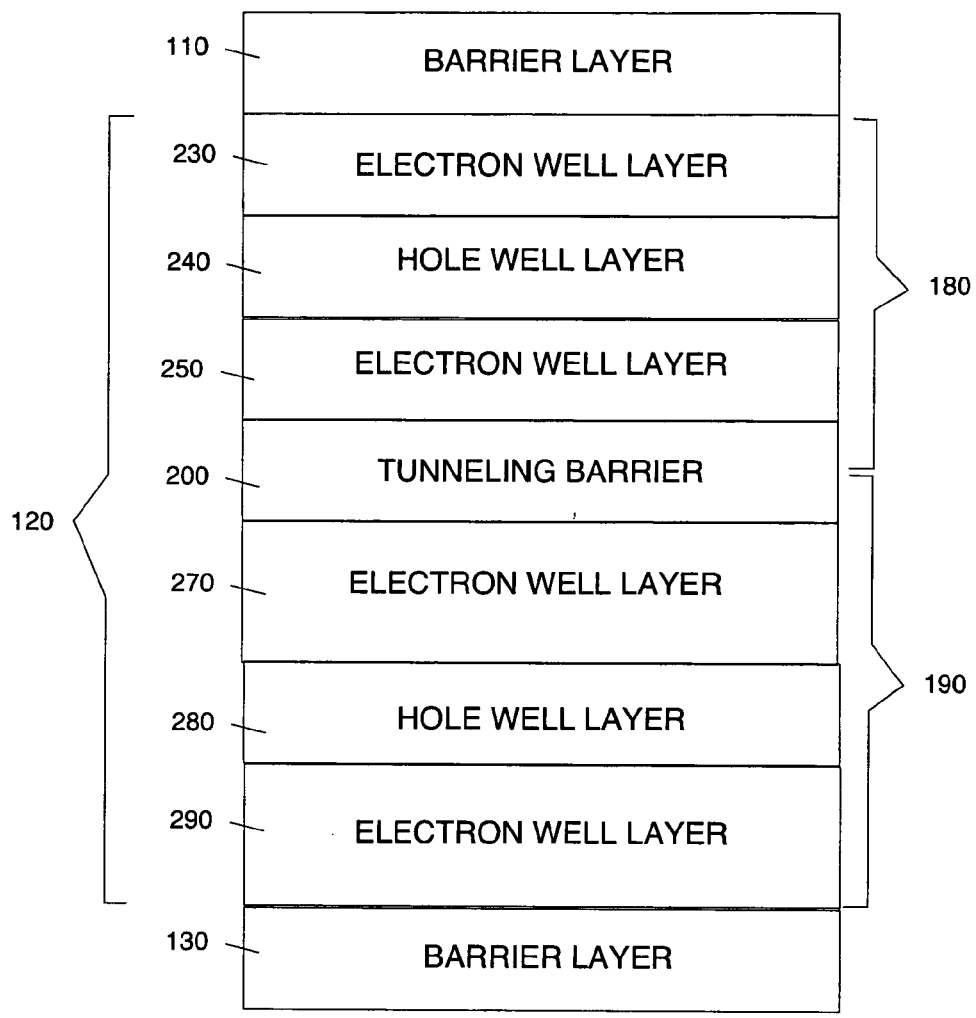
FIG. 3B depicts another exemplary embodiment of a layer structure comprising a multi-step interband cascade region.

Referring to FIGS. 2, 3A and 3B, in multiple exemplary embodiment, each substructure 40 may comprise barrier layers 110, 130, 150, 170 and multistep interband cascade regions 120, 140, 160. A laser light may be emitted from the plurality of potential well layers 210, 220, 230-250, 270-290, for both the (conduction band) electrons and the (valence band) holes, within the multistep interband cascade regions 120, 140, 160. Each photon of the light may be emitted as a result of an interband electronic transition between a conduction band energy level and a valence band energy level. Interband electronic transition between a conduction band energy level and a valence band energy level may occur between the lowest energy conduction-band level and the highest energy valence-band level. Although substructure 40, shown in FIG. 2, is depicted as comprising three multistep cascade regions 120, 140, 160 and three barrier layers 130, 150 170, substructure 40 is not to be limited to only three multistep cascade regions and three barrier layers. Substructure 40 may comprise one or more multistep cascade regions and one or more barrier layers.

Besides separating the multistep interband cascade regions 120, 140, 160, one or more of the barrier layers 110, 130, 150, 170 may also serve as absorbing regions for the optical pump energy and may split the holes and electrons that are generated from the absorbed pump light so that the holes may flow in one direction and the electrons may flow in the opposite direction. A schematic band structure diagram illustrating this exemplary embodiment is shown in FIG. 4A.

An exemplary embodiment of multistep cascade region 120 within the substructure 40 is depicted in FIG. 3A. Although the following discussion refers to multistep cascade region 120, this is done for clarity reasons and the following discussion may equally apply to other multistep cascade regions 140 and 160. In this exemplary embodiment, each step, 180, 190 of the multistep interband cascade region 120 may comprise a plurality of Type I quantum well structures. For a Type I quantum well structure, a potential well (quantum well) for the electrons and a potential well (quantum well) for the holes may be obtained from the well layers 210, 220. The barrier layers 110, 200 and 130 may serve as the potential barriers that sandwich the two Type I quantum well layers, 210, 220. Type I quantum wells typically may be suitable for lasers, when constructed from antimonide-based materials, that emit at wavelengths of 2.7 microns or shorter.

Referring to FIG. 3A, a first Type I quantum well region may comprise well layer 210 sandwiched between barrier layers 110 and 200. Well layer 210 may comprise material such as GaInAsSb. Barrier layer 110 may serve as a pump light absorbing region with tilted energy bands and may be formed from a material such as GaInAlAsSb. Barrier layer 200 may serve as a tunneling barrier and may be formed from a material such as AlAsSb or GaAlAsSb. A second Type I quantum well region may comprise well layer 220 sandwiched between barrier layers 200 and 130. Well layer 220 may be formed from a material such as GaInAs. Barrier layer 130 may serve as a pump light absorbing region with tilted energy bands and may be formed from a material such as GaInAlAsSb. The first and the second Type I quantum well regions may share a tunneling barrier 200.

Figure 5A:
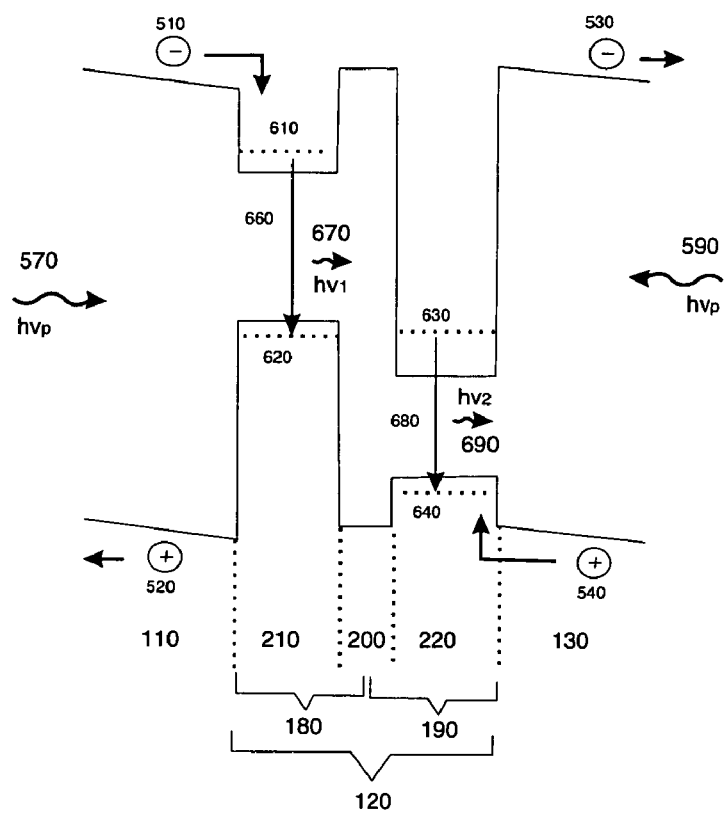
FIG. 5A depicts a more detailed exemplary energy band diagram of embodiment in FIG. 3A.

Although multistep cascade region 120, shown in FIG. 3A, is depicted as comprising of two-steps, 180 and 190, multistep interband cascade regions 120, 140, 160 may comprise more than two-steps. Each step 180, 190 may contain a different Type I quantum well layer. For example, if the interband cascade regions 120, 140, 160 comprise five steps, there would be five different quantum well layers, one for each step of the cascade. A Type I quantum well may, for example, be constructed from three layers of material. A layer of well material 210, 220 may be sandwiched between two layers of barrier materials 110, 200 and 200, 130, respectively, that have a larger bandgap, with higher conduction band and valence band energies, than the well material 210, 220. Thus, potential wells may be produced in both the conduction band and the valence band and may result in quantum confinement for both electrons and holes. The quantum-confining barrier layers also may have other functions, such as being absorbers of the pump light, being regions that split the holes and electrons that are generated from the pump-light absorption, being tunneling barriers 200, and being cladding regions for an optical waveguide. The two type-I quantum well regions in steps 180 and 190 may be separated by a tunneling barrier 200 that may, for example, be formed from materials such as InAlAsSb. A schematic band structure diagram illustrating a two-step cascade of Type I quantum wells is shown in FIG. 5A.

Another exemplary embodiment of multistep cascade region 120 within the substructure 40 is depicted in FIG. 3B. Although the following discussion refers to multistep cascade region 120, this is done for clarity reasons and this discussion may equally apply to multistep cascade regions 140 and 160. In this embodiment, each step, 180, 190 of the multistep interband cascade region 120 may comprise a plurality of W-well structures wherein each W-well structure (hereinafter "Type-II quantum well structure") may have a Type-II energy band alignment. Each Type-II quantum well structure may comprise hole well layers 240 and 280 sandwiched between a pair of electron well layers 230, 250 and 270, 290, respectfully. The Type-II quantum well structures increase the overlap between the wave functions for the electron and the hole when Type II energy band alignments are used, thus improving the efficiency of the light-emitting transition while also reducing the non-radiative, Auger recombinations. Type II quantum wells often are desired for antimonide-based lasers that emit at wavelengths of 2.5 microns or longer.

Figure 5B:
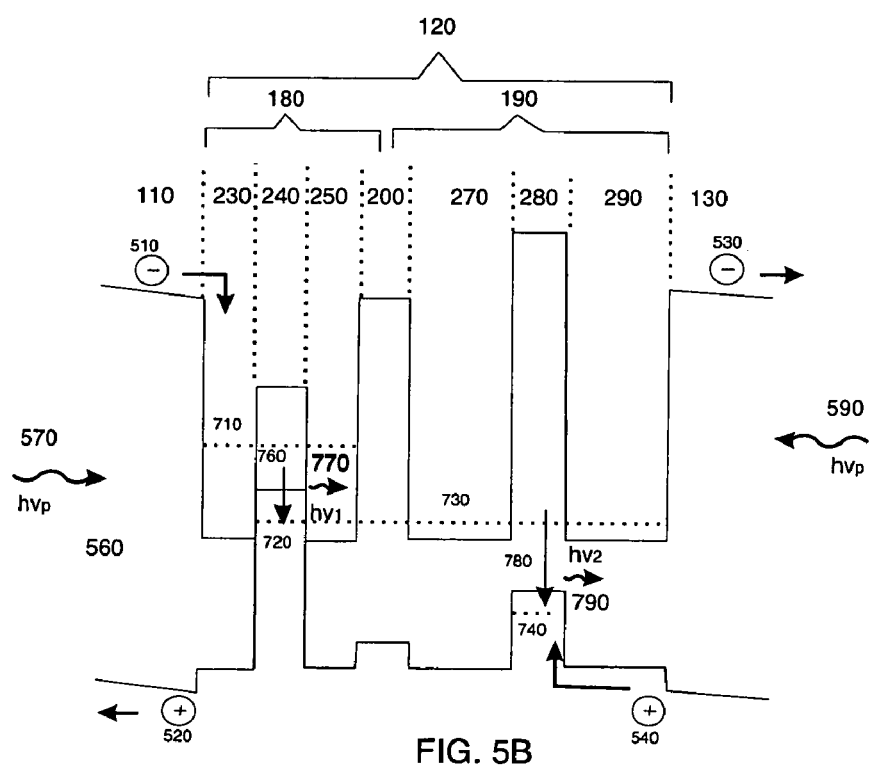
FIG. 5B depicts a more detailed exemplary energy band diagram of embodiment in FIG. 3B.
Figure 5C:
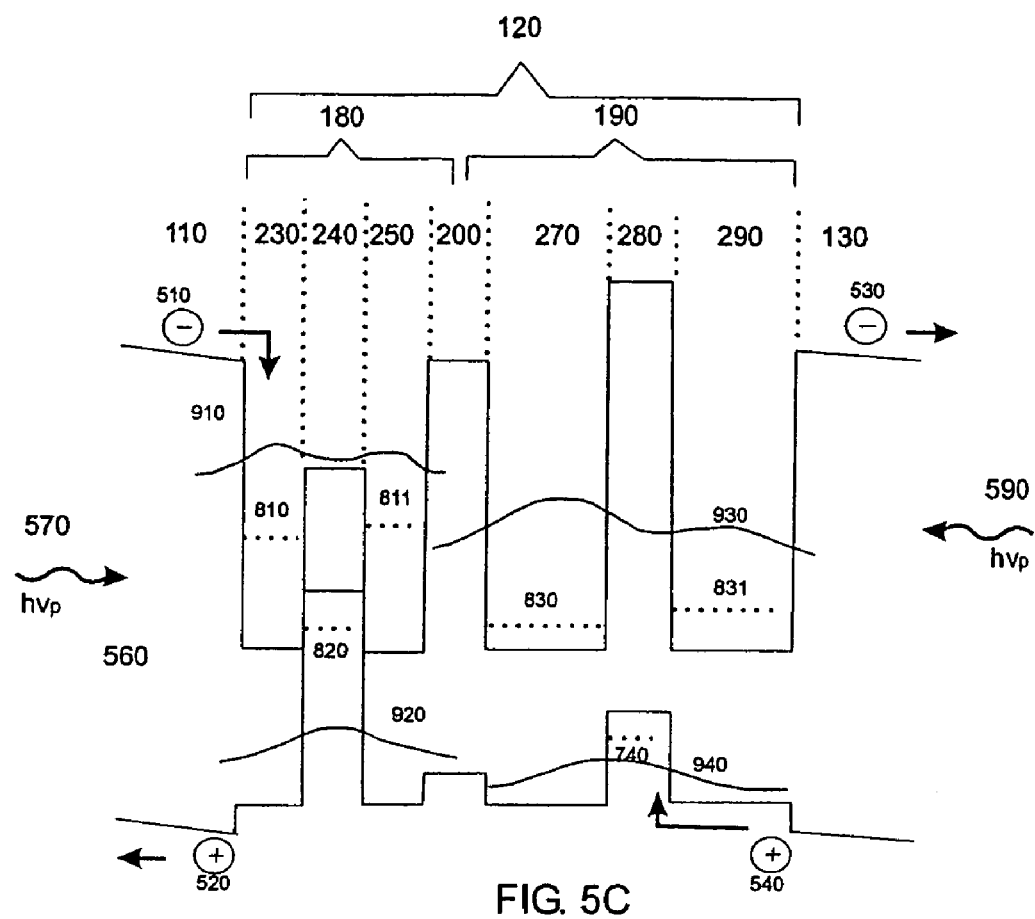
FIG. 5C depicts another more detailed exemplary energy band diagram of embodiment in FIG. 3B.

Although multistep cascade region 120, shown in FIG. 3B, is depicted as comprising two-steps, 180 and 190, multistep interband cascade regions 120, 140, 160 may comprise more than two steps and more than two different type-II quantum well structures within a single multistep interband cascade region 120. The type-II quantum well structure in step 180 may be formed of a hole well layer 240 sandwiched between electron well layers 230, 250. Electron well layers 230, 250 may, for example, be formed from materials such as InAs or InAsSb. Hole well layer 240 may, for example, be formed from materials such as GaInSb. The type-II quantum well structure in step 190 may be formed of a hole well layer 280 sandwiched between electron well layers 270, 290. Electron well layers 270, 290 may, for example, be formed from materials such as InAs. Hole well layer 280 may, for example, be formed from materials such as AlGaSb. The electron well layers 230 and 250 may have a thickness that is different from the thickness of electron well layers 270 and 290. The two type-II quantum well regions in steps 180 and 190 may be separated by a tunneling barrier 200 that may, for example, be formed from materials such as InAlAsSb. A schematic band structure diagram illustrating a two-step cascade of Type II quantum wells is shown in FIGS. 5B, 5C.

With an interband cascade, the optical (light emitting) transition occurs as a result of the recombination of holes and electrons (an interband electronic transition between a conduction-band energy state and a valence-band energy state). With the epitaxial-growth defined interband cascade, each conduction-band electron generated from the absorbed pump light and supplied from the barriers, such as 110, 130, 150, 170 shown in FIG. 2, may produce a multiple of photons, with potentially one photon produced in each step 180 and 190 of each multistep cascade region 120, 140, 160. Thus, the energy of the optical pump may be used more efficiently to generate photons in the IC-OPL structure 10.

Referring to FIGS. 3A and 3B, the Type I or Type II quantum well regions in each step 180, 190 of the multistep cascade regions 120, 140 may be different in their material compositions and layer thicknesses. Different material compositions and layer thicknesses within multistep cascade regions 120, 140, 160 may produce band-energy cascades for both the holes and the electrons while also determining the emission wavelength for each step. Such exemplary energy band cascades are further illustrated schematically in energy band diagrams in FIGS. 4A, 4B.

The barrier layers 110, 130, 150, 170 abutting two adjacent multistep interband cascade regions 120, 140, 160 may be grown with energy slopes for both the valence band and the conduction band. The energy slopes of the barrier layers 110, 130, 150, 170 may assist the flow of electrons and holes (in opposite directions) into the adjacent multistep interband cascade regions 120, 140, 160. The exemplary sloped conduction band and the exemplary sloped valence band of a pump light absorbing barrier layer 110, 130, 150, 170 are further illustrated schematically in energy band diagrams in FIGS. 4A, 4B. A material such as AlGaInAsSb may, for example, be used to construct the absorber barrier layers 110, 130, 150, 170 that have tilted or sloped conduction band and valence band. The percentages of the various constituent elements in this material are varied as the layer is grown, in such a way that the desired variations in the conduction and valence band energies are achieved with a minimum amount of accumulated strain (from mismatch of the lattice constant in the crystalline material).

Referring to FIG. 4A, in one exemplary embodiment, substructure 40 may comprise three multistep cascade regions, 120, 140, 160 each of which has two steps 180 and 190. There are four barrier layers, 110, 130, 150, 170 that may function as absorbing regions for the pump light and also may have tilted conduction and valence bands that split the electrons and holes generated as a result of the pump absorption. A photo-generated electron, represented by ⊖, in barrier layers 110, 130 and 150 would be directed into cascade regions 120, 140 and 160, respectively. Likewise, a photo-generated hole, represented by ⊕, in barrier layers 130, 150 and 170 would be directed into multistep cascade regions 120, 140 and 160, respectively. However, photo-generated holes in barrier 110 and photo-generated electrons in barrier 170 would be directed away from the multistep cascade regions 120 and 160, respectfully and would not contribute to the generation of light by the cascade regions. An external electrical path (not shown) may be provided between barrier layers 110 and 170 so that those holes and electrons can recombine, non-radiatively. Assuming IC-OPL 10 comprises a single substructure 40, cladding layer 30 may optionally be doped p-type and cladding layer 50 may optionally be doped n-type to facilitate the flow of the holes and electrons that may be directed away from the multistep cascade regions 120 and 160. In addition, the material composition of cladding layer 30 may be graded near the interface of layer 30 with multistep cascade region 120 to achieve a smooth variation of the conduction band edge. Likewise, the material composition of cladding layer 50 may be graded near the interface of layer 50 with multistep cascade region 160 to achieve a smooth variation of the valence band edge.

In other exemplary embodiments, only some of the barrier layers 110, 130, 150 and 170 may be formed to absorb the optical pump energy and split the photogenerated holes and electrons. Referring to FIG. 2, in one exemplary embodiment, only the barrier layers 130 and 150 may be grown to function as absorbing regions. In this exemplary embodiment, an electrical path may be provided that may allow electrons that flow away from multistep cascade regions 160 to be replaced by electrons from barrier layer 110 that flow toward multistep cascade regions 120. Such an exemplary embodiment of IC-OPL 10 may be suitable if the barrier layer 110 and cladding layers 30, 50, 60, 70, as shown in FIG. 1, are formed from n-type materials. Assuming IC-OPL 10 comprises a single substructure 40, the barrier layer 110 and cladding layer 30, as shown in FIGS. 1 and 2, may be the same layer. A schematic band structure diagram illustrating this embodiment is shown in FIG. 4B.

Referring to FIG. 4B, in an exemplary embodiment, substructure 40 may comprise two multistep cascade regions 120, 140 each having two steps 180 and 190. The barrier layers 130, 150 may function to absorb the pump light and also to split the photo-generated electrons and holes. There also are n-doped cladding layers 30 and 50. Cladding layer 30 is adjacent to cascade region 120 and cladding layer 50 is adjacent to barrier layer 150. Photo-generated electrons in barrier layer 150 are directed into cladding layer 50. An external electrical path (not shown) may be provided for the charge of those electrons to be compensated by injection of electrons into cladding layer 30 and then into multistep cascade region 120. The material composition of the heterojunction interfaces between absorber barrier 150 and cladding layer 50 may be graded to facilitate the flow of the electrons. The material composition of cladding layer 30 also may be graded to reduce the bandgap near the interface of layer 30 with multistep cascade region 120. Cladding layer 30 may comprise a region 32 with abrupt heavy n-type doping and another region 34 with abrupt p-type doping. The two regions 32 and 34 may serve to ensure that multistep cascade regions 120 and 140 and barrier layers 130 and 150 are normally depleted of free carriers. Electrons in the conduction band of cladding layer 30 may tunnel through the tunneling barrier 36 into a conduction band state in step 180 of multistep cascade region 120.

Referring to FIGS. 3A and 5A, in one exemplary embodiment, an electron 510 and a hole 520 may be generated as a result of absorption of a photon 570 of wavelength $hv_p$ from pump light in absorber layer 110. An electron 530 and a hole 540 may be generated as a result of absorption of a photon 590 of wavelength $hv_p$ from pump light in absorber layer 130. Electron 510 may be injected into multistep interband cascade region 120 from the absorber layer 110 and hole 540 may be injected into multistep interband cascade region 120 from the absorber layer 130. Hole 520 and electron 530 are directed away from multistep interband cascade region 120 as a result of the tilted conduction and valence bands in absorber layers 110 and 130.

In this exemplary embodiment, electrons may be confined in the vicinity of first well layer 210 and second well layer 220 because of the potential wells in the conduction band. Likewise holes may be confined in the vicinity of well layers 210 and 220 because of potential wells in the valence band. The quantum well containing well layer 210 has a conduction band (CB) energy level 610 (represented by a horizontal dotted line) and a valence band (VB) energy level 620 (represented by a horizontal dotted line). The quantum well containing well layer 220 has a CB energy level 630 (represented by a horizontal dotted line) and a VB energy level 640 (represented by a horizontal dotted line). The VB energy level 620 may approximately coincide in energy with the CB energy level 630 so as to be coupled to each other as a result of enhanced tunneling through tunneling barrier 200. The tunneling is enhanced due to the energy of VB level 620 being approximately equal to the energy of CB level 630. For clarity, each of the quantum wells 210, 220 is assumed to have only one CB energy level 610, 630, respectively, and one VB energy level 620, 640, respectively. In actuality, the quantum wells 210, 220 may comprise multiple CB energy levels, and multiple VB energy levels.

Referring to FIG. 5A, in one exemplary embodiment, the electron 510 injected from barrier 110 occupies CB level 610. An electron 510 then makes a first interband transition 660 into VB level 620. A first photon 670 of wavelength $hv_1$ may be emitted as a result of that interband transition 660. An electron in VB level 620 may then tunnel, for example via interband tunneling, through the tunneling barrier 200 into CB level 630. An electron in CB level 630 may then make a second interband transition 680 into VB level 640 that may be occupied by hole 540 that is injected from barrier 130. A second photon 690 of wavelength $hv_2$ may be emitted as a result of that second interband transition 680. In essence two photons 670 and 690 may be produced as a result of the recombination of an electron 510 and a hole 540 that were injected into the multistep interband cascade region 120. Photons 670 and 690 may be emitted, as a result of interband transitions 660, 680, at the same wavelength ($hv_1 = hv_2$) or at different wavelength ($hv_1$, $hv_2$) as to be described below.

Although the exemplary embodiment in FIG. 5A discusses a multistep interband cascade region 120 with only two steps 180, 190, it should be evident to anyone skilled in the art that a multistep interband cascade region having more than two steps may also be implemented thereby emitting more photons. More photons may be emitted per the electron 510 and the hole 540 that is injected into the multistep interband cascade region 120 if the multistep interband cascade region 120 had more steps. For example, if the multistep interband cascade region 120 were to have 3 steps, 3 photons may be emitted as a result of the injection of the electron 510 and the hole 540.

Referring to FIGS. 3B and 5B, in another exemplary embodiment, an electron 510 and a hole 520 may be generated as a result of absorption of a photon 570 of wavelength $hv_p$ of pump light in absorber layer 110. An electron 530 and a hole 540 may be generated as a result of absorption of a photon 590 of wavelength $hv_p$ from pump light in absorber layer 130. Electron 510 may be injected into multistep interband cascade region 120 from the absorber layer 110 and hole 540 may be injected into multistep interband cascade region 120 from the absorber layer 130. Hole 520 and electron 530 are directed away from the multistep interband cascade region 120 as a result of the tilted conduction and valence bands in absorber layers 110 and 130.

Referring to FIG. 5B, in one exemplary embodiment, barrier layer 110 provides one of the conduction-band potential barriers for the electron well in layer 230. Tunneling barrier 200 provides one of the potential barriers for the electron well in layer 250. The other potential barrier for the electrons is provided by hole well layer 240. The electron well layers 230 and 250 provide the valence-band potential barriers for the holes that are confined in the vicinity of hole well layer 240. In a similar way, barrier layer 130, tunneling barrier 200 and hole well layer 280 provide potential barriers for the electrons confined by the coupled quantum wells defined by electron well layers 270 and 290. Again, in a similar way, electron well layers 270 and 290 provide the potential barriers for the holes that are confined in the vicinity of hole well layer 280.

In this exemplary embodiment, electrons may be confined in the vicinity of well layers 230, 250 and well layer 270, 290 because of the potential wells in the conduction band. Likewise holes may be confined in the vicinity of well layers 240 and 280 because of potential wells in the valence band. The coupled quantum wells for electrons defined by electron well layers 230 and 250 have a CB energy level 710 (represented by a horizontal dotted line). The quantum well for holes defined by hole well layer 240 has a VB energy level 720 (represented by a horizontal dotted line). The coupled quantum wells for electrons defined by electron well layers 270 and 290 have a CB energy level 730 (represented by a horizontal dotted line). The quantum well for holes defined by hole well layer 280 has a VB energy level 740 (represented by a horizontal dotted line). The VB energy level 720 may approximately coincide in energy with the CB energy levels 730 so as to be coupled to each other as a result of enhanced tunneling through tunneling barrier 200. The tunneling is enhanced because the energy of VB level 720 is approximately equal to the energy of CB level 730. For clarity, each quantum well 230, 250 and 270, 290 is assumed to have only one CB energy level 710, 730, respectively, and each quantum well 240, 280 is assumed to have only one VB energy levels 720, 740, respectively. The quantum wells 230, 250, 270, 290 may actually comprise multiple CB energy levels, and the quantum wells 240, 280 may actually comprise multiple VB energy levels.

Referring to FIG. 5B, in one exemplary embodiment, the electron 510 injected from barrier 110 occupies CB level 710. An electron from level 710 then makes a first interband transition 760 into VB level 720. A first photon 770 of wavelength $hv_1$ may be emitted as a result of that interband transition 760. An electron in VB level 720 may then tunnel via interband tunneling or resonant interband tunneling through the tunneling barrier 200 into CB level 730. An electron in CB level 730 may then make a second interband transition 780 into VB level 740 that may be occupied by hole 540 that is injected from barrier 130. A second photon 790 of wavelength $hv_2$ may be emitted as a result of that second interband transition 780. In essence two photons 770 and 790 may be produced as a result of the recombination of an electron 510 and a hole 540 that were injected into the multistep interband cascade region 120. Photons 770 and 790 may be emitted, as a result of interband transitions 760, 780, at the same wavelength ($hv_1=hv_2$) or at different wavelength ($hv_1$ $hv_2$) as to be described below.

Although the exemplary embodiment in FIG. 5B discusses a multistep interband cascade region 120 with only two steps 180, 190, it should be evident to anyone skilled in the art that a multistep interband cascade region having more than two steps may also be implemented thereby emitting more photons. More photons may be emitted per the electron 510 and the hole 540 that are injected into the multistep interband cascade region 120 if the multistep interband cascade region 120 had more steps. For example, if the multistep interband cascade region 120 were to have 3 steps, 3 photons may be emitted as a result of the injection of the electron 510 and the hole 540.

In another exemplary embodiment, the composition of the hole-well layer 240 or the hole-well layer 280 could be designed so as to achieve a compressive strain that can improve the light-emission characteristics of the corresponding Type-II quantum well structure. For example, increasing strain may be obtained when more Indium is used in the GaInSb material of hole-well layer 240. The strain in a hole-well layer may result in greater confinement of the hole wavefunction and better overlap between the hole wave-function and the corresponding electron wave-function for the coupled electron wells. The effects of incorporating such strain in the hole well layer has been described in Journal of Applied Physics, v.92, n.10, pp. 5621-5626 (2002), incorporated herein in its entirety.

The tunneling barrier layer 200 has multiple functions. Besides some of the functions described above, the tunneling barrier 200 may also reduce the likelihood that electron 510 injected into the first step 180 of the multistep cascade region 120 will tunnel directly or make a thermionic transition into the electron well in the second step 190 of multistep cascade region 120 without first making an interband transition. Similarly, the tunneling barrier 200 may reduce the likelihood that hole 540 injected into the second step 190 of the multistep cascade region 120 would make an interband transition before tunneling into the hole well in the first step 180. The height of the tunneling potential barriers for those electrons and holes and the width of the tunneling barrier layer 200 may be adjusted so that the light-emitting interband transition time may be shorter than the time for direct (intraband) tunneling of the carriers injected from the pump absorbing barriers 110, 130.

Referring to FIGS. 3B and 5C, in another exemplary embodiment, the extents of the electron and hole wavefunctions in a given quantum well structure may be mismatched so that the undesired direct (intraband) tunneling may be reduced. Although Type-II well structures are illustrated in FIGS. 3B and 5C, the principles discussed may also be applied to multistep interband cascade regions comprising Type-I quantum wells.

In this exemplary embodiment, an electron 510 and a hole 520 may be generated as a result of absorption of a photon 570 of wavelength $hv_p$ of pump light in absorber layer 110. An electron 530 and a hole 540 may be generated as a result of absorption of a photon 590 of wavelength $hv_p$ from pump light in absorber layer 130. Electron 510 may be injected into multistep interband cascade region 120 from the absorber layer 110 and hole 540 may be injected into multistep interband cascade region 120 from the absorber layer 130. Hole 520 and electron 530 are directed away from multistep interband cascade region 120 as a result of the tilted conduction and valence bands in absorber layers 110 and 130.

Referring to FIG. 5C, in one exemplary embodiment, barrier layer 110 provides one of the conduction-band potential barriers for the electron well in layer 230. Tunneling barrier 200 provides one of the potential barriers for the electron well in layer 250. The other potential barrier for the electrons is provided by hole well layer 240. The electron well layers 230 and 250 provide the valence-band potential barriers for the holes that are confined in the vicinity of hole well layer 240. In a similar way, barrier layer 130, tunneling barrier 200 and hole well layer 280 provide potential barriers for the electrons confined by the coupled quantum wells defined by electron well layers 270 and 290. Again, in a similar way, electron well layers 270 and 290 provide the potential barriers for the holes that are confined in the vicinity of hole well layer 280.

Referring to FIG. 5C, in one exemplary embodiment electron well 230 may be slightly wider than electron well 250. Thus, electron level 810 defined by well 230 may have a slightly lower energy than the electron level 811 defined by well 250. Since the energies of the two electron levels 810 and 811 differ only slightly, a coupled-well electron wavefunction 910 still may be defined. The coupled-well electron wavefunction 910 may be confined more in the vicinity of electron well layer 230 than in the vicinity of electron well layer 250, and thereby farther from tunneling barrier 200. Thus, the coupled-well electron wavefunction 910 does not extend appreciably into the tunneling barrier 200. This may reduce the direct tunneling from a CB state in step 180 to a CB state in step 190. On the other hand, electron well 270 is slightly wider than electron well 290. Thus, electron level 830 defined by well 270 has a slightly lower energy than the electron level 831 defined by well 290. Since the energies of those two electron levels 830 and 831 differ only slightly, a coupled-well electron wavefunction 930 still may be defined. This coupled-well electron wavefunction 930 is confined more in the vicinity of electron well layer 270 than in the vicinity of electron well layer 290, and thereby closer to tunneling barrier 200. Thus, the coupled-well electron wavefunction 930 may extend appreciably into the tunneling barrier 200. This increases the probability of the desired interband tunneling between a CB state in step 190 and a VB state, such as hole level 820, in step 180. Given that this increased interband tunneling probability may be higher than necessary, it might be possible in this exemplary embodiment to further increase the thickness of tunneling barrier 200 and still maintain sufficient interband tunneling. Having a thicker tunneling barrier 200 may reduce the direct tunneling of holes from a VB state in step 190 into a VB state in step 180 and, may also, further reduce the direct tunneling of electrons from the CB in step 180 into the CB in step 190. For this exemplary embodiment, the material compositions of the hole well layers 240, 280 may need to be adjusted so that the light emitted by the associated interband transitions have the desired wavelengths. Note that although electron wavefunctions 910 and 930 are not centered with respect to the W-shaped well structures, there still is significant spatial overlap between those electron wavefunctions 910, 930 and their associated hole wavefunctions 920 and 940. The hole wavefunctions 920 and 940 may be approximately centered with respect to the W-shaped well structures.

Figure 3C:
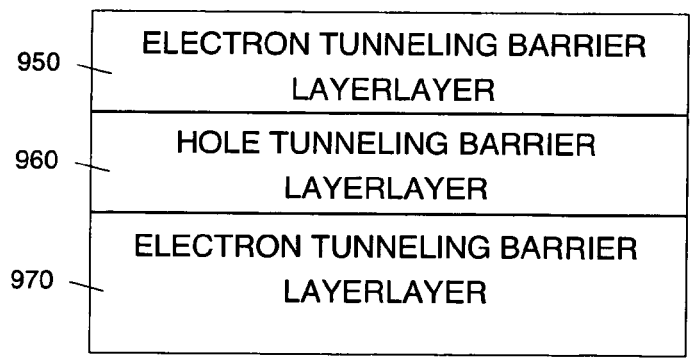
FIG. 3C depicts an exemplary embodiment of a layer structure comprising a tunneling barrier.
Figure 6:
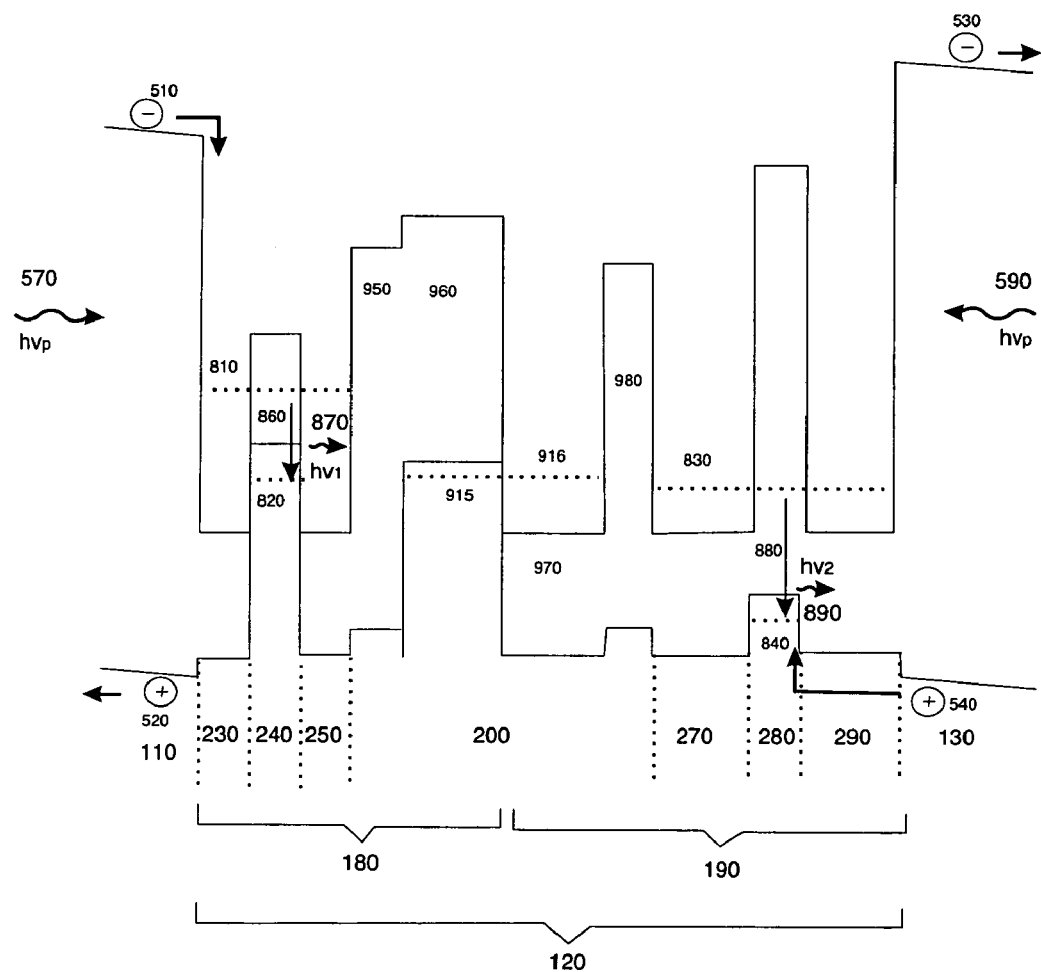
FIG. 6 depicts another more detailed exemplary energy band diagram of embodiment in FIGS. 3B and 3C.

Referring to FIGS. 3C and 6, in another exemplary embodiment, the tunneling barrier 200 may be formed so as to assist in the interband tunneling between a hole wavefunction of one well and an electron wavefunction of an adjacent well.

Referring to FIGS. 3B, 3C and 6, in this exemplary embodiment, an electron 510 and a hole 520 may be generated as a result of absorption of a photon 570 of wavelength $h\nu_p$ of pump light in absorber layer 110. An electron 530 and a hole 540 may be generated as a result of absorption of a photon 590 of wavelength $h\nu_p$ from pump light in absorber layer 130. Electron 510 may be injected into multistep interband cascade region 120 from the absorber layer 110 and hole 540 may be injected into multistep interband cascade region 120 from the absorber layer 130. Hole 520 and electron 530 are directed away from multistep interband cascade region 120 as a result of the tilted conduction and valence bands in absorber layers 110 and 130.

Referring to FIG. 6, in one exemplary embodiment, barrier layer 110 provides one of the conduction-band potential barriers for the electron well in layer 230. Tunneling barrier 200 provides one of the potential barriers for the electron well in layer 250. The other potential barrier for the electrons is provided by hole well layer 240. The electron well layers 230 and 250 provide the valence-band potential barriers for the holes that are confined in the vicinity of hole well layer 240. In a similar way, barrier layer 130, tunneling barrier 200 and hole well layer 280 provide potential barriers for the electrons confined by the coupled quantum wells defined by electron well layers 270 and 290. Again, in a similar way, electron well layers 270 and 290 provide the potential barriers for the holes that are confined in the vicinity of hole well layer 280.

In this exemplary embodiment, electrons may be confined in the vicinity of well layers 230, 250 and well layer 270, 290 because of the potential wells in the conduction band. Likewise holes may be confined in the vicinity of well layers 240 and 280 because of potential wells in the valence band. The coupled quantum wells for electrons defined by electron well layers 230 and 250 have a CB energy level 810 (represented by a horizontal dotted line). The quantum well for holes defined by hole well layer 240 has a VB energy level 820 (represented by a horizontal dotted line). The coupled quantum wells for electrons defined by electron well layers 270 and 290 have a CB energy level 830 (represented by a horizontal dotted line). The quantum well for holes defined by hole well layer 280 has a VB energy levels 840 (represented by a horizontal dotted line). The VB energy level 820 may approximately coincide in energy with the CB energy levels 830 so as to be coupled to each other as a result of enhanced tunneling through tunneling barrier 200. The tunneling is enhanced because the energy of VB level 820 is approximately equal to the energy of CB level 830. For clarity, each quantum well 230, 250 and 270, 290 is assumed to have only one CB energy level 810, 830, respectively, and each quantum well 240, 280 is assumed to have only one VB energy levels 820, 840, respectively. The quantum wells 230, 250, 270, 290 may actually comprise multiple CB energy levels, and the quantum wells 240, 280 may actually comprise multiple VB energy levels.

Referring to FIGS. 3C and 6, the modified tunneling barrier 200 may comprise two, three or four layers—a primary tunneling barrier layer 950, an optional electron-tunneling barrier enhancement layer 960, an optional hole-tunneling barrier enhancement layer 970 and an optional secondary tunneling barrier layer 980. The primary tunneling barrier layer 950 and the secondary tunneling barrier layer 980 may be formed from materials such as AlGaSb. The electron-tunneling barrier enhancement layer 960 may be formed from materials such as AlGaSb. The hole-tunneling barrier enhancement layer 970 may be formed from materials such as InAs or InGaAs.

The primary tunneling barrier layer 950 may serve as a barrier for electron well layer 250 and may prevent direct (intraband) tunneling of electrons from step 180 CB level 810 into a CB level in the second step 190 of the multistep cascade region 120. The primary tunneling barrier 950 also serves as a barrier for direct (intraband) tunneling of holes from step 190 VB level 840 into a VB level in the first step 180. The optional secondary tunneling barrier 980 may serve as a barrier for electron well layer 270 and as a tunneling barrier for higher-energy electrons defined by coupled electron well layers 270 and 290. Secondary tunneling barrier 980 also can serve as a barrier to tunneling between some VB states in steps 180 and 190. An optional electron-tunneling barrier enhancement layer 960 can be added to further reduce the direct (intraband) tunneling of electrons from step 180 CB level 810 into the second step 190 of the multistep cascade region 120. However, the electron-tunneling barrier enhancement layer 960 may not prevent interband tunneling between certain VB states of step 180 and certain CB states of step 190. Instead, barrier enhancement layer 960 may have one or more VB states 915 that may serve to resonantly enhance the interband tunneling between steps 180 and 190. Likewise, an optional hole-tunneling barrier enhancement layer 970 may be added to further reduce the direct (intraband) tunneling of holes from step 190 VB level 840 into the first step 180 of the multistep cascade region 120. However, the hole-tunneling barrier enhancement layer 970 may not prevent interband tunneling between certain VB states of step 180 and certain CB states of step 190. Instead, barrier enhancement layer 970 may have one or more CB states 916 that serve to resonantly enhance the interband tunneling between steps 180 and 190. The resonant enhancement may occur due to the energies of VB state or states 915 and CB state or states 916 being approximately equal to the energies of VB state 820 and CB state 830. The thicknesses of electron-tunneling barrier enhancement layer 960 and hole-tunneling barrier enhancement layer 970 may be adjusted so as to reduce the direct (intraband) tunneling from CB level 810 and from VB level 840. The thickness and composition of the primary tunneling barrier layer 950 and optional secondary tunneling barrier layer 980 may be adjusted so as not to restrict the interband tunneling between VB level 820 and CB level 830.

Referring to FIG. 6, in one exemplary embodiment, the electron 510 injected from barrier 110 occupies CB level 810. An electron from level 810 then makes a first interband transition 860 into VB level 820. A first photon 870 of wavelength $hv_1$ may be emitted as a result of that interband transition 860. An electron in VB level 820 may then tunnel, for example via resonant interband tunneling involving VB state or states 915 and CB state or states 916, through the primary tunneling barrier layer 950, the electron-tunneling barrier enhancement layer 960, the hole-tunneling barrier enhancement layer 970 and the secondary tunneling barrier 980 into CB level 830. An electron in CB level 830 may then make a second interband transition 880 into VB level 840 that may be occupied by hole 540 that is injected from barrier 130. A second photon 890 of wavelength $hv_2$ may be emitted as a result of that second interband transition 880. In essence two photons 870 and 890 may be produced as a result of the recombination of an electron 510 and a hole 540 that were injected into the multistep interband cascade region 120. Photons 870 and 890 may be emitted, as a result of interband transitions 860, 880, at the same wavelength ($hv_1=hv_2$) or at different wavelength ($hv_1$ $hv_2$) as to be described below.

Although the exemplary embodiment in FIG. 6 discusses a multistep interband cascade region 120 with only two steps 180, 190, it should be evident to anyone skilled in the art that a multistep interband cascade region having more than two steps may also be implemented thereby emitting more photons. More photons may be emitted per the electron 510 and the hole 540 that is injected into the multistep interband cascade region 120 if the multistep interband cascade region 120 had more steps. For example, if the multistep interband cascade region 120 were to have 3 steps, 3 photons may be emitted as a result of the injection of the electron 510 and the hole 540.

Referring to FIG. 2, each cascade of multiple Type-I or Type-II quantum well regions 120, 140, 160 may be separated from its adjacent cascade by barrier layers 110, 130, 150, 170. The absorber barrier layers 110, 130, 150, 170 confine the holes and electrons into the Type-I and Type-II quantum well regions. The absorber barriers 110, 130, 150, 170 may also absorb the pump wavelength but not the wavelengths emitted by the Type-I or Type-II quantum well regions. Layers composed of materials such as AlGaAsSb, GaInAsSb, GaAlSb, AlAsSb, AlSb or even AlGaInAsSb may serve as the absorber barriers 110, 130, 150, 170.

Referring to FIGS. 5A, 5B, 5C, the energy of the conduction-band edge in absorber barrier 110, 130 may be higher than the CB energy level 610, 710 or 810 in the Type-I or Type-II quantum well region, respectively. Likewise, the energy of the valence-band edge in absorber barrier 130, 150 may be greater than the VB energy level 640, 740 or 840 in the Type-I or Type-II quantum well region, respectively. The energy gap of the absorber barrier may be smaller or fairly close to the pump energy, so that the cascade regions 120, 140, 160 may have as many steps as possible.

The absorber barrier layers 110, 130, 150 may further form electrical-potential gradients in both the conduction band and the valence band that assist the desired flow of electrons and holes, respectively, into the Type-I or Type-II quantum well regions. Each photo-generated electron hole pair in the absorber barrier layer may be split with the electron directed in one direction and the hole directed to an opposite direction. One way to form the potential gradients may be through delta doping. Alternatively, the composition of the absorber barrier layers may be graded to achieve the potential gradients. It is to be understood that composition grade in the absorber barrier does not so much change the bandgap but rather creates a tilt in both the valence and conduction bands (with both bands being tilted in the same direction). A material having sufficient degrees of freedom to achieve the combination of lattice match, band-energy and bandgap constraints for the absorber barrier may be, for example, AlGaInAsSb. Further, an absorber barrier layer may be used that self-compensates for strain (with the strain in one portion of the absorber barrier layer compensating for the strain in another portion of that absorber barrier layer).

The IC-OPL structure 10 may comprise multiple interband cascade regions 120, 140, 160 within each substructure 40. The different quantum well regions of a given interband cascade region 120, 140, 160 may have the same or different light-emission (or luminescence) spectra.

Each substructure 40 may be formed from an assembly of multiple interband cascade regions and absorber barriers. In one exemplary embodiment, all of the substructures 40 and the quantum well regions in them could have the same emission spectrum. In another exemplary embodiment, each substructure 40 may emit at its own emission spectrum. For example, region 120 would emit light of a first wavelength, region 140 would emit light of a second wavelength and region 160 would emit light of a third wavelength. In this way, the overall width of the luminescence spectrum of the laser can be increased.

In yet another exemplary embodiment, the larger luminescence spectrum may be achieved by having the different quantum wells in different steps of a given multistep interband cascade region emit light of different wavelengths. For example, Type I quantum well 210 could have an interband transition that emits light of a first wavelength $hv_1$ and Type I quantum well 220 could have an interband transition that emits light of a second wavelength $hv_2$ (where $hv_1$ is different from $hv_2$). For either quantum well type, achievement of the differing emission wavelengths may be done by changing the thicknesses and compositions of the materials in the layers that comprise those quantum well structures.

In yet another exemplary embodiment, the cascade regions with the same overall emission spectrum may be grouped together in the same substructure with different groups of cascade regions, i.e., different substructures 40, having different emission spectra. In yet another exemplary embodiment, the cascades with different emission spectra may be placed in an alternating configuration in the same substructure 40.

The different multistep interband cascade regions compete for the optical pump light and the carriers generated from absorption of that pump light. Light not absorbed in the absorber barriers surrounding one multistep interband cascade region may be available for absorption by the absorber barriers surrounding another multistep interband cascade region. A given quantum well region may absorb the light generated in another quantum well region. This characteristic may used to design the number of wells emitting at each wavelength so that the desired shape of the emission spectrum is achieved. The longest-wavelength light may be absorbed by a smaller number of quantum well regions, since the wells that emit at shorter wavelengths will not absorb that longest-wavelength light.

There are a number of ways for enhancing the efficiency with which the optical pump light is absorbed by the OPL. In one embodiment, the efficiency with which the optical pump light may be absorbed may be enhanced by constructing an optical cavity for the pump light so that the pump light makes multiple vertical passes through the cascade/barrier substructures of the OPL. This type of optical cavity is described in Applied Physics Letters, v.75, n.19, pp. 2876-2878 (1999) and incorporated herein in its entirety. The optical reflectors for the pump light may be located above and below the substructures 40. These reflectors may be incorporated into the cladding layers 30 and 50 or may be separate from those cladding layers.

In another exemplary embodiment, an optical pump laser may be integrated into the IC-OPL 10 and the pump light co-propagates, in the same longitudinal directions, with the light emitted by the IC-OPL 10. In this exemplary embodiment, the pump light makes multiple longitudinal passes through the OPICL substructures 40. The optical reflectors for the pump light may be located at the ends of the OPL substrate, perpendicular to the longitudinal axis. The integration of an optical pump into the OPL structure is described in the U.S. application Ser. No. 11/090,453 which is incorporated herein in its entirety.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. Other embodiments are within the scope of the claims. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. An optical waveguide, comprising:
   one or more multistep interband cascade regions comprising:
   a plurality of electrically coupled quantum well regions;
   at least one tunneling barrier formed between adjacent said quantum well regions; and
   one or more absorber barriers formed adjacent said one or more multistep interband cascade regions, wherein said absorber barriers generate a plurality of holes and a plurality of electrons by absorbing optical-pump light, wherein at least a portion of said plurality of holes and plurality of electrons propagate in opposite directions into said adjacent one or more multistep interband cascade regions.

2. The optical waveguide of claim 1 further comprising:
   one or more cladding layers formed adjacent said one or more multistep interband cascade regions, wherein at least one of said one or more cladding layers contains n-type material.

3. The optical waveguide of claim 1 wherein said one or more absorber barriers has a graded composition to direct said portion of said plurality of holes and said portion of said plurality of electrons toward said quantum well regions.

4. The optical waveguide of claim 1 wherein at least one of said quantum well regions comprises material layers containing different composition or thickness from at least one other quantum well region of said quantum well regions.

5. The optical waveguide of claim 1 wherein at least one of said plurality of electrically coupled quantum well regions is wider than at least one other of said plurality of electrically coupled quantum well regions.

6. An optical waveguide, comprising:
   one or more absorber barrier layers able to absorb at least one pump photon from an optical pump and generate a hole and an electron from said at least one photon; and
   one or more multistep interband cascade regions able to generate through interband transition a plurality of photons from said at least one pump photon absorbed within said one or more absorber barrier layers.

7. The optical waveguide of claim 6 wherein said one or more absorber barrier layers have spatially varying energies for the edges of the conduction band and the valence band, said spatially varying energies arranged to facilitate propagation of said hole and said electron in said opposite directions towards two different multistep interband cascade regions adjacent to said one or more barrier layers.

8. The optical waveguide of claim 6 wherein said one or more multistep interband cascade regions comprise:
   a plurality of electrically coupled quantum well regions; and
   at least one tunneling barrier formed between adjacent said quantum well regions, wherein said one or more absorber barriers confine said hole and said electron within said quantum well regions.

9. The optical waveguide of claim 8 wherein said at least one tunneling barrier comprises multiple layers.

10. The optical waveguide of claim 8 wherein each said quantum well region contains a conduction-band potential well with at least one energy state and a valence band potential well with at least one energy state and wherein said at least one tunneling barrier propagates electrons or holes between said at least one energy state of said valence band potential well and said at least one energy state of said conduction band potential well of adjacent said quantum well regions.

11. The optical waveguide of claim 10 wherein said at least one energy state of said conduction-band potential well is approximately equal to at least one energy state of said valence band potential well.

12. The optical waveguide of claim 6 wherein at least one of said quantum well regions comprises material layers containing different composition or thickness from at least one other quantum well region of said quantum well regions.

13. The optical waveguide of claim 6 wherein each multistep interband cascade region of said one or more multistep interband cascade regions comprises at least a first and a second quantum well region, wherein a first portion of said plurality of photons is emitted from said first quantum well region and a second portion of said plurality of photons is emitted from said second quantum well region.

14. The optical waveguide of claim 13 wherein the energy or wavelength of said first portion of said plurality of photons is different from the energy or wavelength of said second portion of said plurality of photons.

15. The optical waveguide of claim 13 wherein the energy or wavelength of said first portion of said plurality of photons is the same as the energy or wavelength of said second portion of said plurality of photons.

16. A method for producing light for a laser, said method comprising:
   supplying at least one pump photon from an optical pump laser;
   generating an electron and a hole from said at least one pump photon within at least one absorber barrier;
   directing said electron and said hole into one or more multistep interband cascade regions; and
   generating a plurality of photons from said at least one pump photon through interband transition within said one or more multistep interband cascade regions.

17. The method of claim 16 wherein said directing said electron and said hole into one or more multistep interband cascade regions comprises directing said hole and said electron to propagate in opposite directions towards one or more multistep interband cascade regions adjacent to said one or more barrier layers.

18. The method of claim 16 further comprises:
   confining said electron in a quantum well conduction band state in a first quantum well region and confining said hole in a quantum well valence band state in a second quantum well region, said first and second quantum well regions being within said one or more multistep interband cascade regions; and
   providing at least one tunneling barrier formed between adjacent said first and second quantum well regions;
   said tunneling barrier coupling said valence band state in said first quantum well and a conduction band state in said second quantum well.

19. The method of claim 16 further comprises:
   providing an external electrical current path connecting one of said at least one absorber barrier and one of said one or more multistep interband cascade regions.

20. The method of claim 18 wherein said tunneling barrier reduces intraband tunneling of said electron from said first quantum well region into said second quantum well region, and wherein said tunneling barrier reduces intraband tunneling of said hole from said second quantum well region into said first quantum well region.

* * * * *